United States Patent [19]
Chien

[11] Patent Number: 6,137,730
[45] Date of Patent: Oct. 24, 2000

[54] BUFFERED BIT-LINE FOR FASTER SENSING AND HIGHER DATA RATE IN MEMORY DEVICES

[76] Inventor: Pien Chien, 5th Fl., No. 24, Lane 476, Sec. 1, Kwong Fu Rd., Hsinchu City, Taiwan

[21] Appl. No.: 09/231,151

[22] Filed: Jan. 15, 1999

[51] Int. Cl.[7] ...................................................... G11C 7/00
[52] U.S. Cl. ................................ 365/189.02; 365/230.03; 365/190
[58] Field of Search .......................... 365/189.02, 230.03, 365/190

[56] References Cited

U.S. PATENT DOCUMENTS

| | | | |
|---|---|---|---|
| 5,506,815 | 4/1996 | Hsieh et al. | 365/230.03 |
| 5,519,655 | 5/1996 | Greenberg | 365/189.02 |

*Primary Examiner*—Andrew Q. Tran
*Attorney, Agent, or Firm*—Claude A. S. Hamrick; Oppenheimer W. Donnelly; Chien-Wei (Chris) Chou

[57] ABSTRACT

A semiconductor integrated circuit device includes a plurality of memory cells subdivided into array blocks each including M cell rows and N cell columns. The array blocks are arranged in array block rows and array block columns. Each cell of each cell row of each array block is coupled to an associated one of M word lines. Each cell of each cell column is selectively coupled to develop a data signal transmitted between an associated bit line pair including a primary bit line and a complementary bit line. A row decoder is coupled to provide a corresponding row address signal to each of the M word lines for addressing the cell rows. Each array block column includes: a plurality of column multiplexers each including N multiplexer input ports connected to receive one of the data signals from one of the bit line pairs of an associated one of the array blocks, and a multiplexer output port providing the data signals from selected ones of the N multiplexer input ports; a plurality of intermediate sense amplifiers each having an amplifier input port connected to receive the data signals from a corresponding one of the multiplexer output ports, and an amplifier output port providing pre-amplified data signals; a plurality of column demultiplexers each including an input port connected to receive a pre-amplified data signal, and a plurality of demultiplexer output ports each connected to one of the bit line pairs of a corresponding one of the array blocks.

1 Claim, 8 Drawing Sheets

BUFFERED BIT-LINE FOR FASTER SENSING AND HIGHER DATA RATE IN MEMORY DEVICES

BACKGROUND OF THE INVENTION

1. Field of the Invention

This invention relates generally to integrated circuit memory devices, and more particularly to an architecture for implementing a memory device which includes an array of memory cells sub-divided into array blocks wherein amplification of data signals received from the array blocks is necessary for improving memory performance.

2. Description of the Prior Art

Semiconductor memory devices include arrays of memory cells for storing data wherein each memory cell typically stores a single data bit. Upon reading data from a memory cell, stored charge flows from the cell to generate a data signal transmitted via a bit line. A certain time interval is required to reach a peak power level for the data signal.

FIG. 1 shows a circuit block diagram of a prior art semiconductor integrated circuit memory device (IC memory device 10) including a plurality of array blocks 12 arranged in array block rows 14, and a plurality of input/output pads (I/O pads) 15. Each array block 12 includes a plurality of memory cells (not shown) arranged in rows and columns as further explained below. Each array block row 14 includes: a number N of the array blocks 12; a row decoder 16 coupled to each array block in the corresponding array block row via row address lines 18; N column decoders 20 each coupled to one of the array blocks 12 via a corresponding set of column address lines 22; N block sense amplifiers 24 each coupled to receive memory data from one of the array blocks 12 via data lines 26; and a global sense amplifier 28 coupled to receive pre-amplified data signals from each of the block sense amplifiers 24 in the row via a plurality of block data lines 30.

The IC memory device 10 also includes an address buffer (not shown) coupled to each of the decoders 16 and 20 of each array block row 14 for accessing memory cells (not shown) of the array blocks 12 wherein the address buffer is coupled to receive address data from an external memory controller (not shown) via designated ones of I/O pads 15. When a memory cell (not shown) of an array block 12 is selected for reading, a low level data signal is generated and transmitted via data lines 26 to a corresponding block sense amplifier 24 for amplification. The block sense amplifiers 24 generate pre-amplified data signals which are transmitted to the global sense amplifier 28. Global output lines 31 connect the global sense amplifiers 28 to particular ones of the I/O pads 15 for outputting the amplified memory data signals from the IC memory device 10. The architecture of the depicted IC memory device 10 dictates the physical layout of components of the circuit and in particular, the physical area occupied by each array block row 14 necessitates the use of long metallization lines for implementing the block data lines 30 and global output lines 31.

The architecture of the depicted prior art memory device also does not allow for optimal memory access performance because of the necessity of long metallization lines for implementing the block data lines 30 and global output line 31. Long metallization lines cause increased attenuation of data signals which causes an increase in memory access times.

The architecture of the depicted prior art memory device also does not allow for optimal memory cell density. Because the depicted architecture requires a corresponding column decoder 14 for addressing memory cells (not shown) of each array block 12, an excessive amount of chip real estate of the IC memory device 10 is occupied by column decoding circuitry. Therefore, the overall memory cell density of the IC memory device 10 is limited in part due to the use of a separate corresponding column decoder for addressing the memory cells of each array block 12.

FIG. 2 shows a block diagram at 40 illustrating a first exemplary prior art array block 12 (FIG. 1) including a plurality of memory cells 42 arranged in a number of rows 44 and columns 46. The memory cells 42 may be, for example, static RAM (SRAM) cells. Each memory cell in a row is coupled to a word line 48 adapted to receive a row address signal from a corresponding output of the row decoder 16 via a corresponding one of the row address lines 18. The depicted array block also includes a plurality of bit line pairs each of which includes a primary bit line 52 and a complementary bit line 54. Each of the bit line pairs is used to address a cell column 46 of the array block 12. The total number of word lines 48 and bit line pairs varies with the total capacity of the memory cell array. The depicted array includes M columns 46 designated COLUMN_0, COLUMN_1, . . . COLUMN_M−1.

Each memory cell 42 includes a first data port 41 connected to a corresponding one of the bit lines 52, a second data port 43 connected to a corresponding one of the complementary bit lines 54, and a word select port 45 connected to receive a row select signal from a corresponding one of the word lines 48. Where the memory cells 42 are SRAM cells, the first and second data ports 41 and 43 are connected to access transistors (not shown) of the cells 42 which include a flip-flop device, for showing data, coupled with the access transistors.

A column multiplexer 60 includes multiplexer input ports each coupled with a corresponding one of the bit line pairs for selecting cell columns 46 of the array 12. The column multiplexer includes M column gate blocks 62 each of which is coupled with a corresponding one of the bit line pairs of the array. Each of the M column gate blocks 62 includes a primary transfer gate 64 and a complementary transfer gate 66. Each primary transfer gate 64 includes a source 67 connected to a corresponding one of the primary bit lines 52, a drain 68 connected to a primary input line 70 of a corresponding one of the block amplifiers 24 via ones of the data lines 26, and a gate 72 connected to receive a corresponding one of column select signals designated CS_0, CS_1, . . . CS_M−1 from the column decoder 20 via a corresponding one of the column select lines 22. Each complementary transfer gate 66 of each M column gate blocks 62 includes a source 77 connected to a corresponding one of the complementary bit lines 54, a drain 78 connected to a complementary input line 80 of the corresponding block amplifier 24 via ones of the data lines 26; and a gate 82 connected to the gate 72 of the corresponding primary transfer gate 64 to receive the corresponding one of the column select signals CS_0, CS_1, . . . CS_M−1.

Each memory cell 42 of array 12 is addressable by row decoder 16, via one of the word lines 48, and by column decoder 20 via a corresponding one of the column select lines 22. Accessing one of the memory cells 42 includes releasing stored charge which represents stored data. Upon reading from a selected memory cell, a data signal is generated as a voltage potential gradually develops between the corresponding primary and complementary bit lines 52, 54. The data signal is provided to the primary and complementary inputs 70 and 80 of the block sense amplifier 214 which amplifies the data signal to provide a pre-amplified data signal across primary and complementary outputs 86 and 88 of the amplifier.

FIG. 3 shows a detailed schematic block diagram at 100 of a second exemplary array block 12 (FIG. 1) including a plurality of dynamic RAM (DRAM) memory cells 102 arranged in a number of rows and columns 104, wherein the rows include a plurality of even rows 106 and a plurality of odd rows 108. Each DRAM cell 102 includes: a cell capacitor 110 having a first terminal 112 connected to ground, and a second terminal 114; and an access transistor 116 having a source 118 connected to the second terminal 114 of the cell capacitor, a cell drain 120, and a cell gate 122. Each DRAM cell 102 of each even row 106 has it's cell drain 120 connected to a corresponding one of the primary bit lines 128, and it's cell gate 122 connected to a corresponding one of even row word lines 130. Each DRAM cell 102 of each odd row 108 has it's cell drain 120 connected to a corresponding one of complementary bit lines 132 and it's cell gate 122 connected to a corresponding one of odd row word lines 134.

Each column 104 of the depicted array block further includes a column amplifier (or array amplifier) 140 providing amplification of data signals developed by each memory cell 102 of the column. Each column amplifier 140 includes a first data port 142 connected to provide a primary signal to a corresponding one of primary bit lines 128, a second data port 144 connected to provide a complementary signal to a corresponding one of complementary bit lines 132, a first control input 146 connected to a first amplifier control line 148 and a second control input 150 connected to a second amplifier control line 152. Each column amplifier 140 typically includes an amplifier device which is enabled by pulling control line 148 to a high voltage level and by pulling control line 152 to ground.

The depicted array block 12 also includes the column multiplexer 60 for selecting columns 104 of the array block wherein each primary transfer gate 64 has its source 67 connected to a corresponding one of the primary bit lines 128, and each corresponding transfer gate 66 has its source 77 connected to a corresponding one of the complementary bit lines 132. Columns 104 of the depicted array block are selected in the same manner as described for the array block of FIG. 2.

In summary, conflicting design goals for semiconductor memory devices include minimizing power consumption while maximizing storage capacity, or memory cell density. As the size of a memory device increases, the length of metallization lines for transmitting data signals increases and the data signals read from each memory cell suffer increased attenuation. Also, as memory cell density increases, the number of memory cells coupled to each metallization line increases causing an increased loading on each metallization line. As power supply levels decrease, the amplitudes of data signals read from memory cells become smaller and more difficult to sense.

If bit line resistance and equalization current are not considered, the time ($\Delta t$) required to build up a differential voltage potential ($\Delta V$) between voltages on corresponding primary and complementary bit line pairs, roughly follows relationship (1), below, $$\Delta t = C_{BL} * \Delta V / i_{CELL} \tag{1}$$

where $C_{BL}$ is the bit line capacitance and $i_{CELL}$ is the memory cell current.

The amplitude of a signal transmitted via one of the bit line pairs is proportional to the level of the power supply (not shown) used in the device 10. The overall resistance and capacitance of each of the bit line pairs increases with the length of the bit lines. As the resistance of each of the bit lines is increased, the amount of power lost to impedance increases. As expressed in Relationship (1), above, the rate of change of voltage potential, $\Delta V$, across one of bit line pairs is proportional to the cycle time, $\Delta t$. Therefore, as cycle time ($\Delta t$) is decreased beyond a certain threshold, the peak voltage potential reached across a bit line pair during a single cycle of a memory array decreases. As the cycle time is decreased, the peak voltage of the data signal may not be strong enough to be sensed during a cycle time. As a result, the minimum cycle time of memory array is limited by the time required to sense the voltage potential across one of the bit line pairs during a single cycle. Therefore, the minimum access time for sensing data in one of the memory cells of memory array is limited by the time required to sense the voltage potential across one of bit line pairs during a single cycle. Therefore, it is desirable to maximize the voltage potential across each of bit line pairs in order to sense the voltage potential across the bit line pairs. Another problem with low amplitude data signals is that the sense amplifying process becomes less stable and more likely to fail.

When the power supplied by a power supply is increased, and the length of bit line pairs is decreased, the potentials between bit line pairs is typically increased. Also, the slew rate of voltage change of the sense amplifier decreases as the power supply level is decreased and the length of bit line pairs is increased. The result of decreasing the power supply level and increasing the length of bit line pairs is that a longer time is required to access the contents of each of memory cells.

It is an object of the present invention to provide an IC memory device architecture wherein memory cell density is optimized and sensing speed maximized while the power supply of the device is scaled down.

It is a further object of the present invention to provide an IC memory device architecture utilizing intermediate sense amplifiers to maximize the data rate with reduced routing complexity.

The present invention provides a memory architecture and method for sensing data from memory cells to resolve the above stated problems. Methods according to principles of the present invention may be applied to any type of memory device.

SUMMARY OF THE INVENTION

Briefly, a presently preferred embodiment of the present invention includes a semiconductor integrated circuit device having a plurality of memory cells subdivided into array blocks each including M cell rows and N cell columns. The array blocks are arranged in array block rows and array block columns. Each cell of each cell row of each array block is coupled to an associated one of M word lines. Each cell of each cell column is selectively coupled to develop a data signal transmitted between an associated bit line pair including a primary bit line and a complementary bit line. A row decoder is coupled to provide a corresponding row address signal to each of the M word lines for addressing cell rows. Each array block column includes a plurality of column multiplexers each including N multiplexer input ports connected to receive one of the data signals from one of the bit line pairs of an associated one of the array blocks, and a multiplexer output port providing the data signals from selected ones of the N multiplexer input ports.

Each array block column also includes: a plurality of intermediate sense amplifiers for amplifying the data signals; and an amplifier input port connected to receive the data signals from a corresponding one of the multiplexer output ports, and an amplifier output port for providing pre-amplified data signals; a plurality of column demultiplexers each including a demultiplexer input port connected to receive the pre-amplified data signals from an associated one of the amplifier output ports, and a plurality of demultiplexer output ports each connected to one of the bit line pairs of a corresponding one of the array blocks. Each array block column further includes: a plurality of column decoders coupled to provide column select signals to each column multiplexer and column demultiplexer of each array block column, wherein each column multiplexer and column demultiplexer of each array block column receives the same set of column select signals.

The foregoing and other objects, features, and advantages of the present invention will be apparent from the following detailed description of the preferred embodiment which makes reference to the several figures of the drawing.

IN THE DRAWINGS

DETAILED DESCRIPTION OF THE PREFERRED EMBODIMENTS

Figure 1:
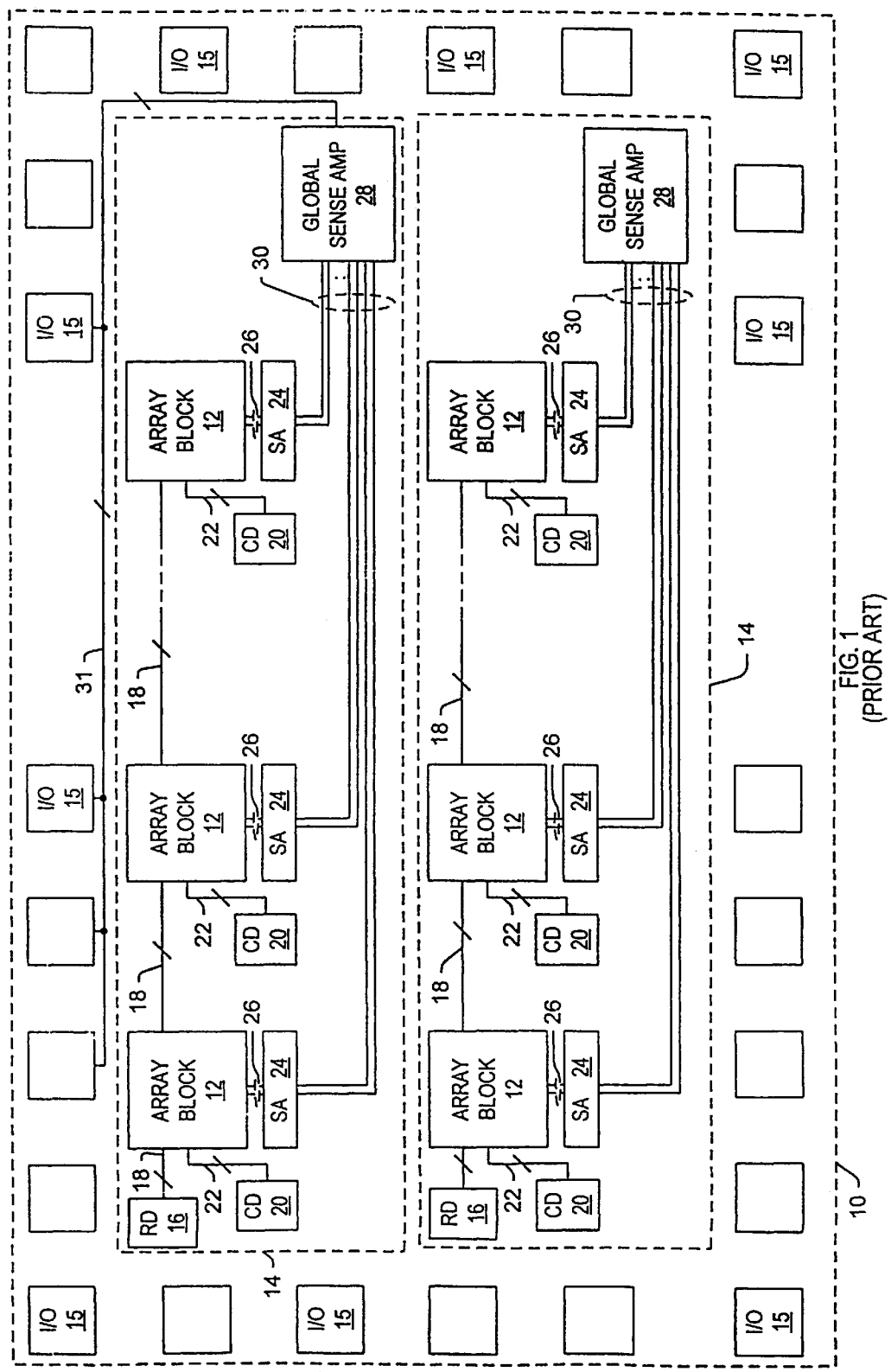
FIG. 1 is a schematic block diagram illustrating a prior art semiconductor integrated circuit device architecture including an array of memory cells subdivided into array blocks coupled with input/output pads via amplification devices according to a prior art design architecture.
Figure 2:
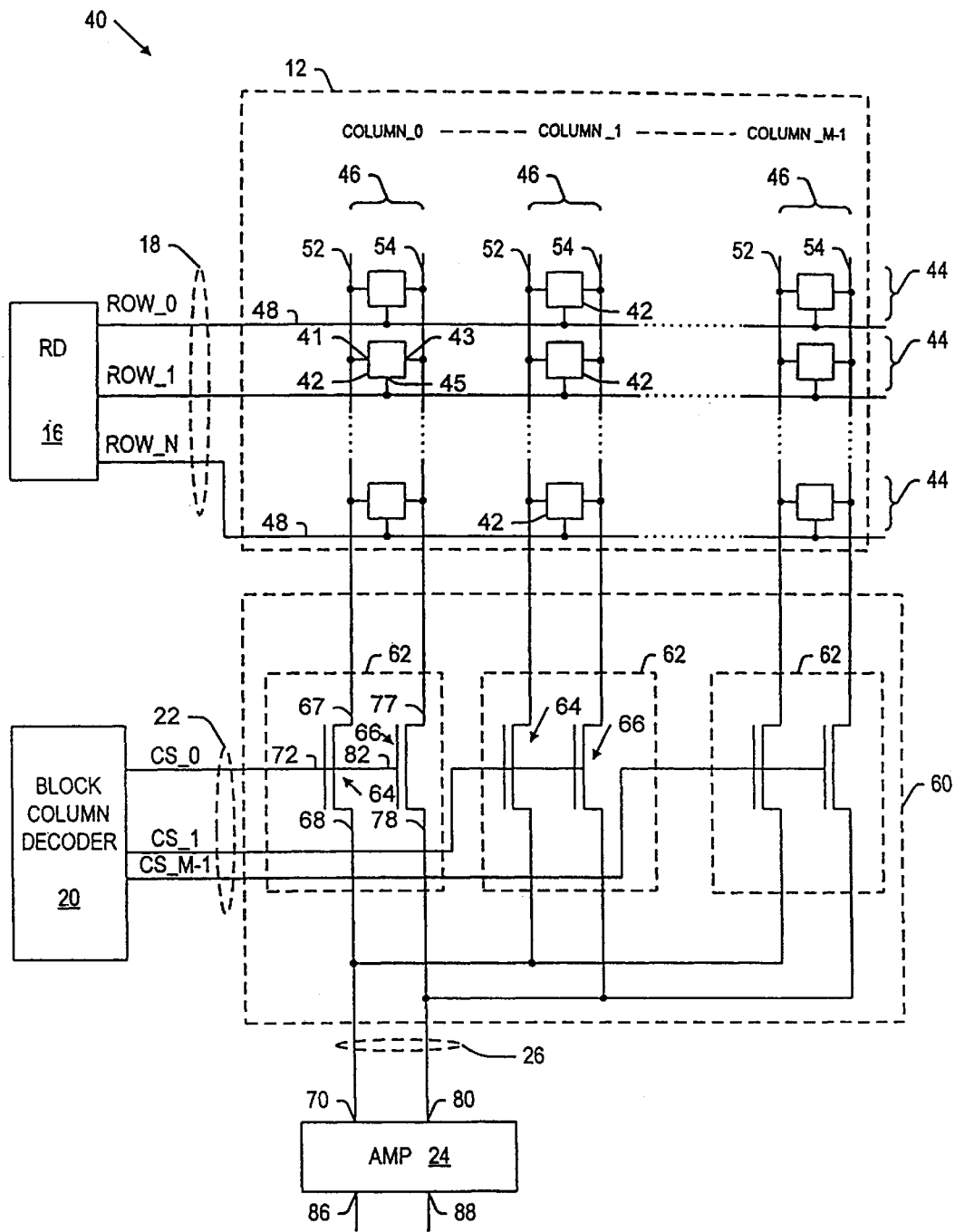
FIG. 2 is a detailed schematic block diagram illustrating a first example of the array block of FIG. 1 coupled with a block amplifier via a column multiplexer controlled by an associated column decoder.
Figure 3:
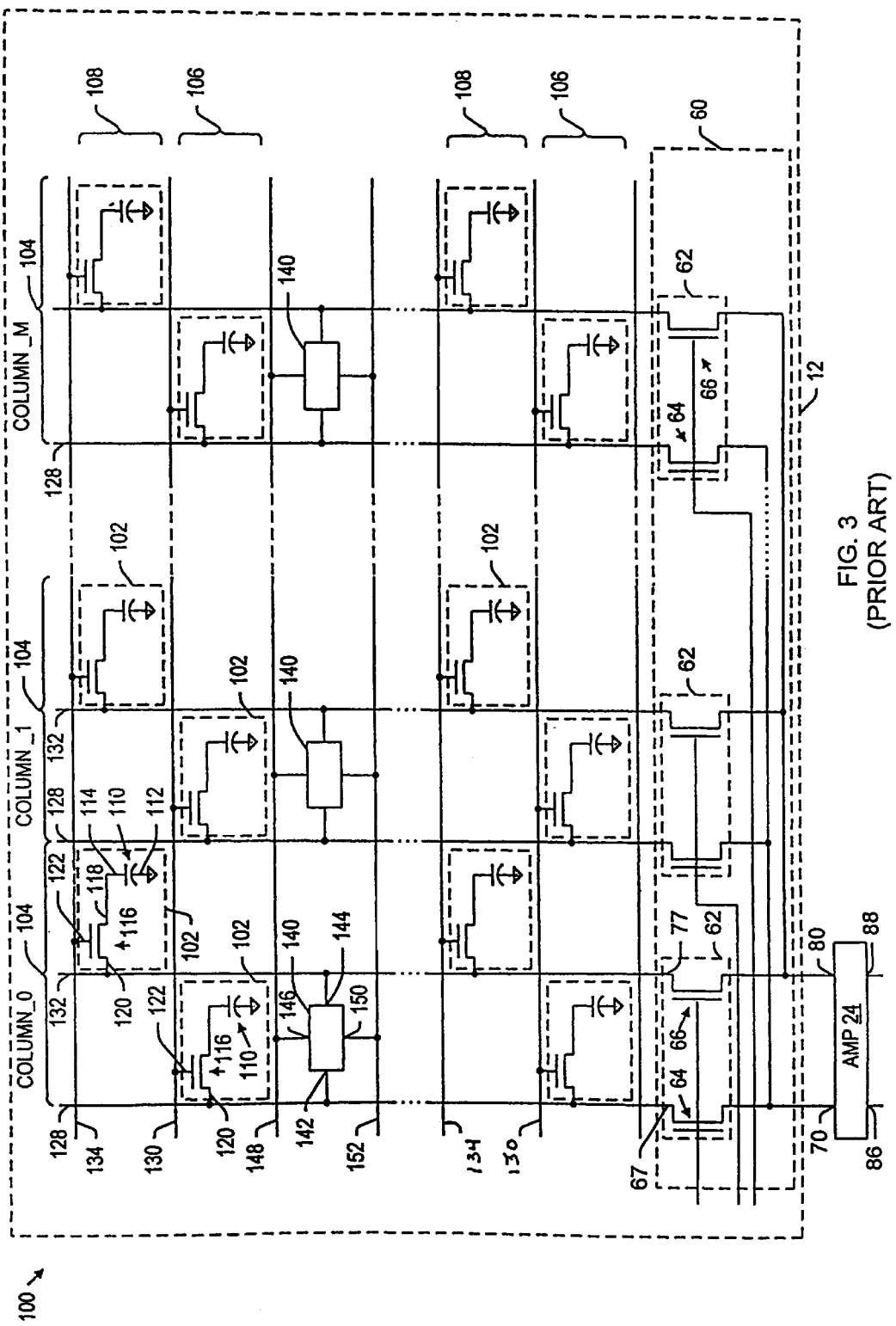
FIG. 3 is a detailed schematic block diagram illustrating a second example of the array block of FIG. 1 including dynamic RAM memory cells and a single column sense amplifier in each column of the array.
Figure 4:
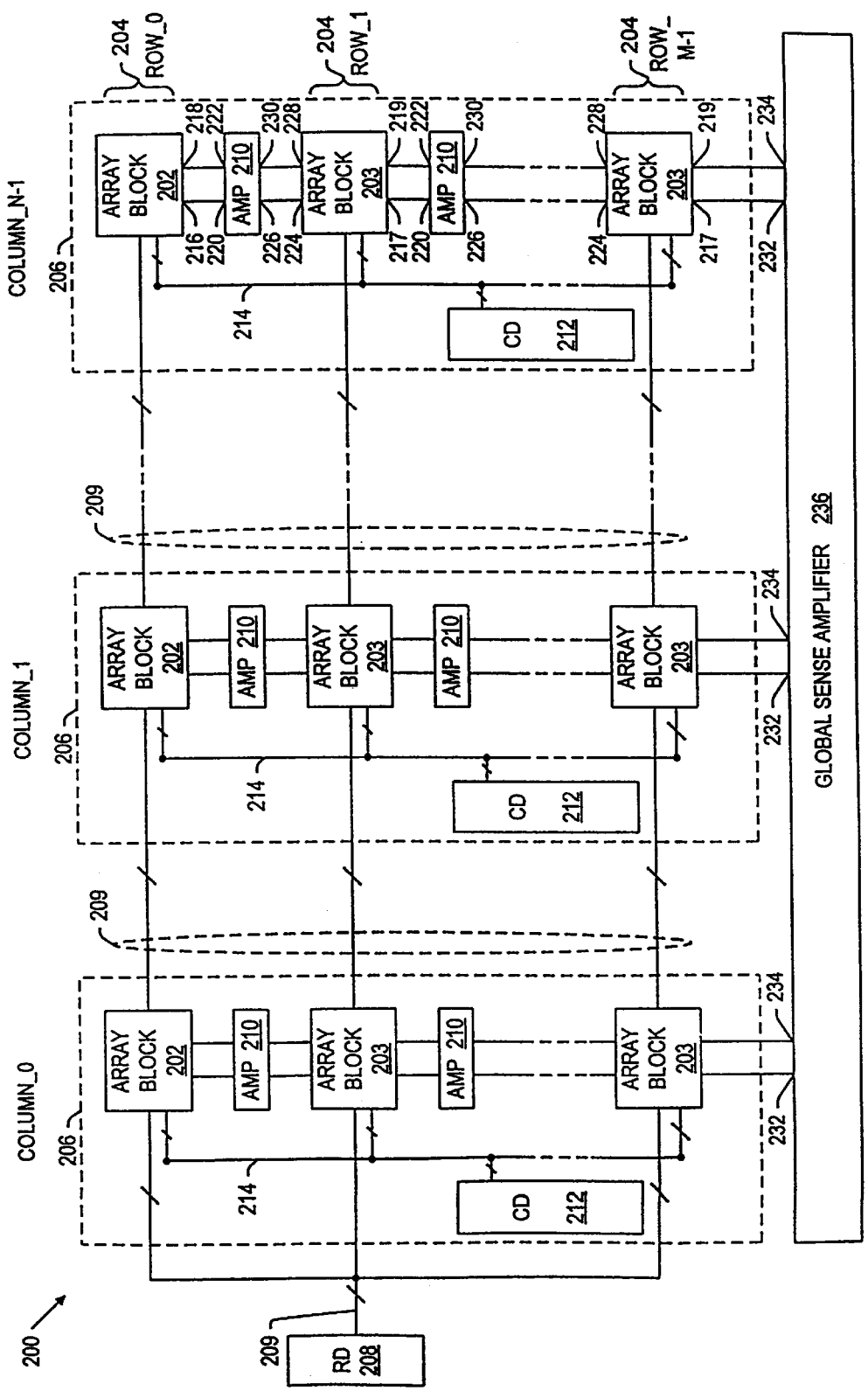
FIG. 4 is a schematic diagram generally illustrating a semiconductor integrated circuit memory device architecture having an array of memory cells subdivided into array blocks including front array blocks and intermediate array blocks intercoupled via intermediate sense amplifiers in accordance with an embodiment of the present invention.

FIG. 4 shows a generalized circuit block diagram at 200 of a semiconductor integrated circuit memory device (IC memory device) according to the present invention. The IC memory device includes a plurality of front array blocks 202 and intermediate array blocks 203 arranged in a matrix including a plurality of M array block rows 204 designated ROW_0, ROW_1, . . . ROW_M-1, and N array block columns 206 designated COLUMN_0, COLUMN_1, . . . COLUMN_N-1. Each of the front array blocks 202 and intermediate array blocks 203 includes a plurality of memory cells (not shown) arranged in rows and columns as further explained below. The first array block row 204 designated ROW_0 includes N front array blocks 202, and each of the remaining array block rows 204 designated ROW_1, . . . ROW_M-1 includes N of the intermediate array blocks 203. Each front array block 202 and each intermediate array block 203 is coupled to receive row address signals from a row decoder 208 via row address lines 209.

Each array block column 206 includes: a front array block 202; M-1 intermediate array blocks 203; M-1 intermediate sense amplifiers 210; and a column decoder 212 coupled to the front array block 202, and to each of the M-1 intermediate array blocks 203 of the array block column 206 via a corresponding set of column select lines 214. Each front array block 202 of each array block column 206 includes a primary block output 216 and a complementary block output 218 connected respectively to a primary amplifier input 220 and a complementary amplifier input 222 of a corresponding one of the intermediate sense amplifiers 210. Each of the intermediate array blocks 203 includes: a primary block input 224 connected to a primary amplifier output 226 of a corresponding one of the amplifiers 210; a complementary block input 228 connected to a complementary amplifier output 230 of the corresponding amplifier 210; a primary block output 217; and a complementary block output 219. The outputs 216 and 218 of each of the intermediate array blocks 203 of the particular array block rows 204 designated ROW_1 to ROW_M-2 are connected respectively to primary and complementary amplifier inputs 220 and 222 of a corresponding one of the amplifiers 210. The outputs 216 and 218 of each of the intermediate array blocks 203 of the last array block row 204 designated ROW_M-1 are connected respectively to a primary global amplifier input 232 and a complementary global amplifier input 234 of a global amplifier 236.

Memory cells (not shown) of the array blocks 202 and 203 of each array block column 206 are selected via row decoder 208 and the corresponding one of the column decoders 212 as further explained below. Data signals generated by selected memory cells of the front array blocks 202 are provided across the outputs 216 and 218 via column multiplexers (not shown) of the front array blocks as further explained below. These data signals are pre-amplified by the immediate sense amplifiers 210 and provided to the inputs 224 and 228 of a corresponding one of the intermediate array blocks 203 each of which includes a column demultiplexer (not shown) as further explained below. Data signals generate by selected memory cells of the intermediate array blocks are provided across the outputs 217 and 219 via column multiplexers (not shown) of the intermediate array blocks 203 as further explained below. Each of the column multiplexers and column demultiplexers of the front end array blocks and intermediate array blocks of a particular array block column 206 are controlled by the corresponding column decoder 212 of the particular array block column 206.

The architecture of the memory device of the present invention provides increased memory cell density over prior art devices because a single column decoder 212 is used to select columns of memory cells (not shown) in each of the array blocks 202 and 203 of the corresponding array block column 206 as further explained below. Also, because the data signals are pre-amplified in multiple stages by the M-1 intermediate sense amplifiers 210 of each array block column 206, memory access times of the memory device are decreased.

Figure 5:
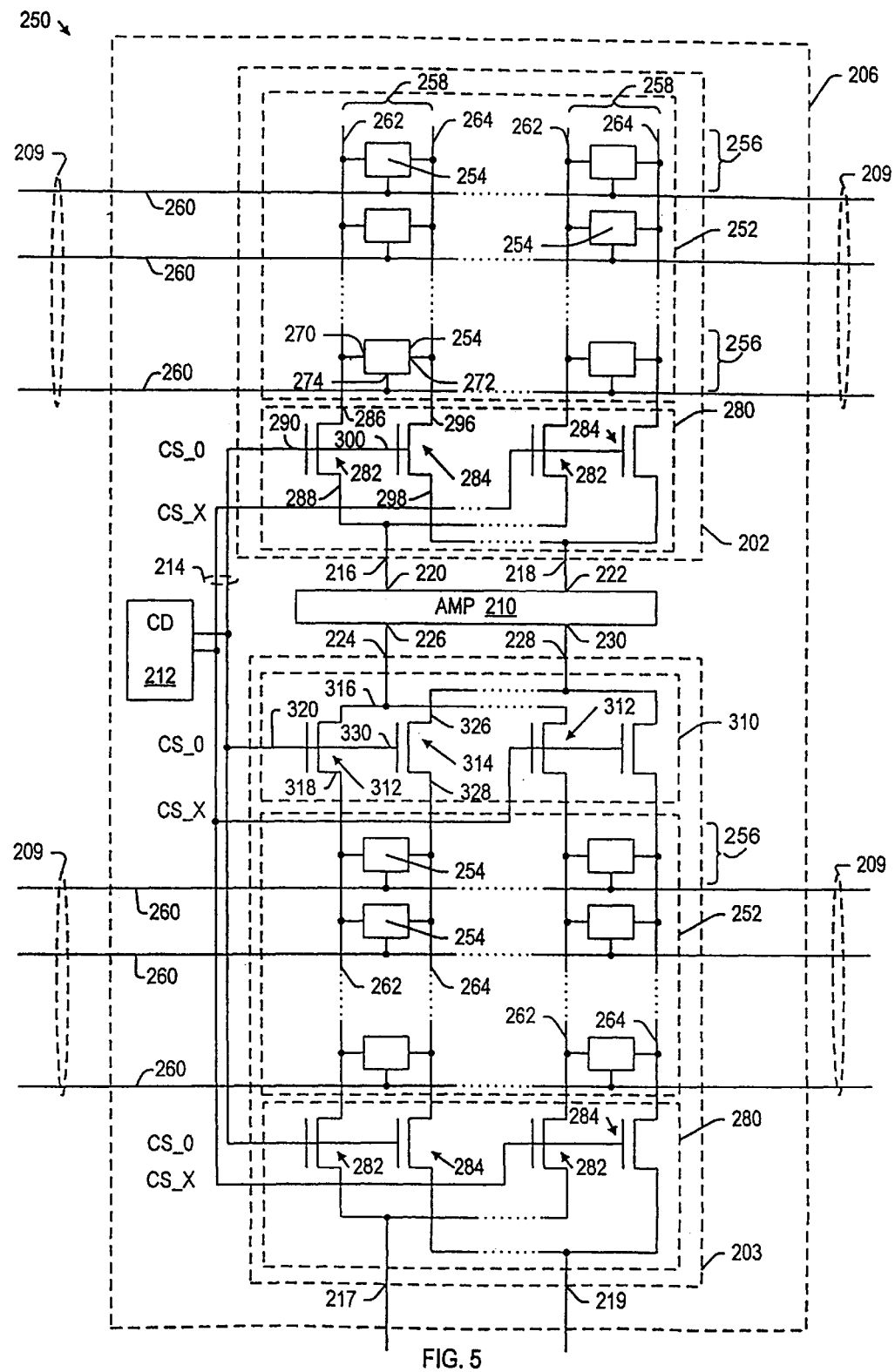
FIG. 5 is a schematic diagram illustrating an embodiment of the device of FIG. 4 wherein each of the array blocks includes dynamic (DRAM) memory cells.

FIG. 5 shows a schematic diagram depicting details at 250 of a first embodiment of the memory device of FIG. 4 wherein each of the front array blocks 202 and intermediate array blocks 203 are implemented using static RAM (SRAM) memory cells. The diagram shows an embodiment of the array block column 206 including one of the front array blocks 202 implemented using SRAM memory cells, one of the intermediate sense amplifiers 210, and one of the intermediate array blocks 203 implemented using SRAM memory cells. The depicted front array block 202 and intermediate array block 203 each include a memory cell array 252 of memory cells 254 arranged in rows 256 and columns 258. Each cell 254 in each row 256 is coupled to a corresponding one of word lines 260 adapted to receive a row address signal from a corresponding output of row decoder 16 (FIG. 4) wherein the word lines 260 implement the row address lines 209. Each memory cell array 252 also includes a plurality of bit line pairs each of which includes a primary bit line 262 and a complementary bit line 264. Each of the bit line pairs is used to address a corresponding one of the columns 258 in the array block. The total number of word lines 260 and bit line pairs varies with the total capacity of the memory cell array. Each memory cell array 252 includes a number, X, of columns 258 and in a preferred embodiment, X is equal to 8. Each memory cell 254 includes a first data port 270 connected to a corresponding one of the primary bit lines 262, a second data port 272 connected to a corresponding one of the complementary bit lines 264, and a word select input 274 connected to a corresponding one of the word lines 260.

Each of the front end array blocks 202 and intermediate array blocks 203 includes a column multiplexer 280 having a plurality of multiplexer input ports each coupled with one of the bit line pairs of the corresponding array 252 for selecting cell columns 258 of memory cells in order to access data stored in the array. Each column multiplexer 280 includes a column gate block for each of the X columns 258 of the array 252, wherein each column gate block includes a primary transfer gate 282 and a complementary transfer gate 284. Each primary transfer gate 282 includes: a source 286 connected to a corresponding one of the primary bit lines 262; a drain 288 connected to the primary output 216, 217 of the array block 202, 203; and a gate 290 connected to receive a corresponding one of column select signals designated CS_0, . . . CS_X from the corresponding column decoder 212 via a corresponding one of the column select lines 214. Each complementary transfer gate 284 includes: a source 296 connected to a corresponding one of the complementary bit lines 264; a drain 298 connected to the complementary output 218, 219 of the array block 202, 203; and a gate 300 connected to the gate 290 of the corresponding primary transfer gate 282 to receive the corresponding one of the column select signals CS_0, . . . CS_X.

The intermediate sense amplifier 210 provides amplification of potential differences developed between each bit line pair, that is between the primary bit line 262 and corresponding complementary bit line 264.

Each of the intermediate array blocks 203 includes a column demultiplexer 310 having a demultiplexer input port coupled to receive the pre-amplified data signals received at inputs 224 and 228 of the intermediate array block 203 and being operative to distribute the data signals over each of the bit line pairs 262, 264 of the columns 258 of the corresponding memory cell array 252 of the intermediate array block 203. Each column demultiplexer 310 includes a demultiplexer column gate block for each of the X columns 258 of the associated array 252 wherein each demultiplexer gate block includes a primary transfer gate 312 and a complementary transfer gate 314. Each primary transfer gate 312 includes: a source 316 connected to the corresponding primary input 224 of the intermediate array block 203; a drain 318 connected to a corresponding one of the primary bit lines 262 of the associated array; and a gate 320 connected to receive a corresponding one of column select signals designated CS_0, . . . CS_X from column decoder 212 via a corresponding one of the column select lines 214. Each complementary transfer gate 314 includes: a source 326 connected to the corresponding complementary input 228 of the intermediate array block 203; a drain 328 connected to a corresponding one of the complementary bit lines 264 of the array; and a gate 330 connected to the gate 320 of the corresponding primary transfer gate 312 to receive the corresponding one of the column select signals CS_0, . . . CS_X.

Figure 6:
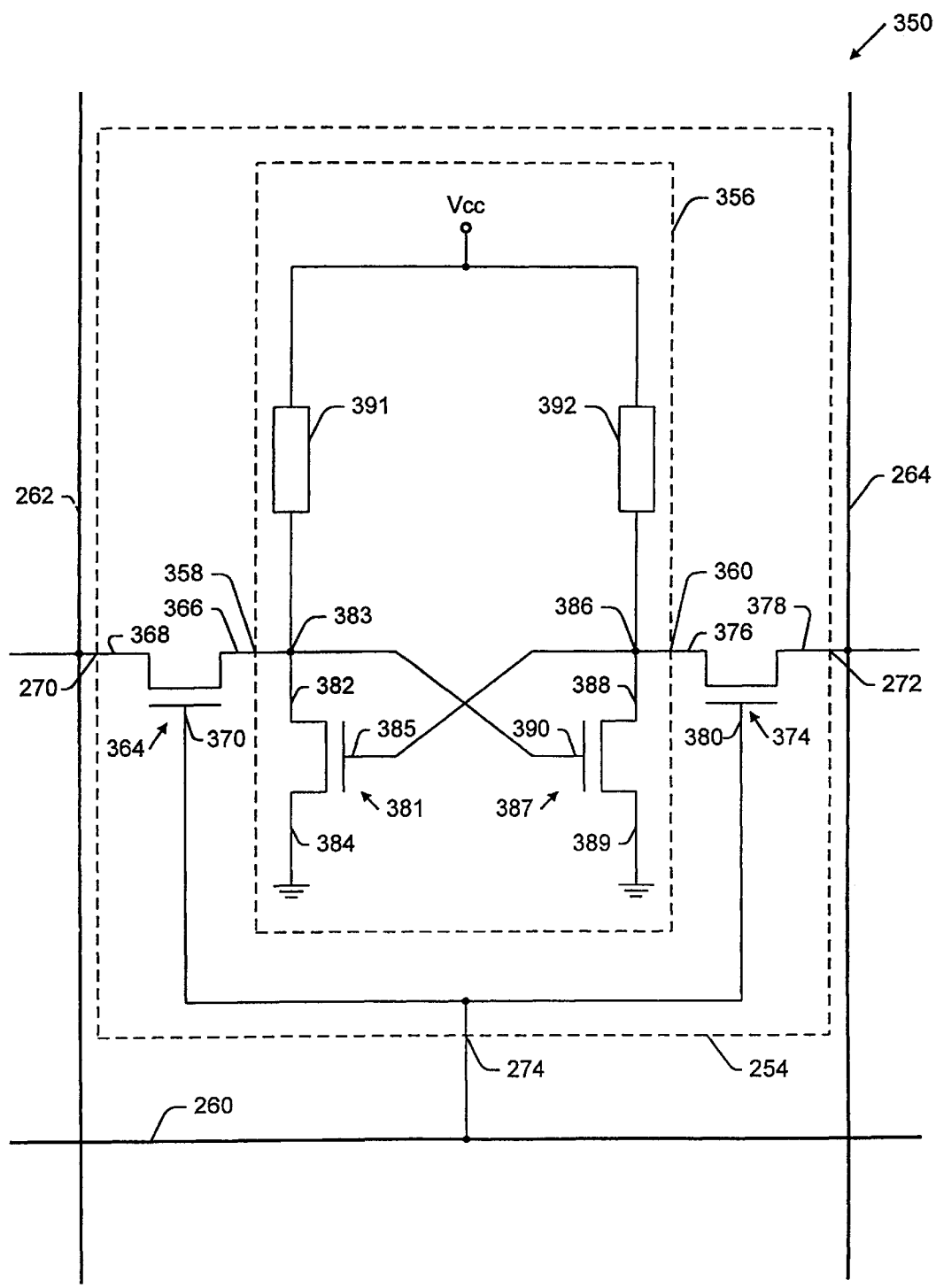
FIG. 6 is a schematic diagram illustrating an embodiment of a static RAM memory cell for implementing the device of FIG. 5.

FIG. 6 shows a schematic diagram at 350 illustrating an embodiment of an SRAM memory cell 254 including: a flip-flop circuit 356 having a first port 358, and a second port 360; a primary access transistor 364 having a source 366 connected to the first port 358 of the flip-flop device, a drain 368 connected to a corresponding primary bit line 262 via the first data port 270 of the memory cell, and a gate 370 connected to a corresponding one of the word lines 260 via the word select port 274 of the memory cell; a complementary access transistor 374 having a source 376 connected to the second port 360 of the flip-flop device, a drain 378 connected to a corresponding complementary bit line 264 via the second data port 272 of the cell, and a gate 380 connected to the word select port 274 of the memory cell. The flip-flop device 356 includes: a first memory transistor 381 having a source 382 connected to a node 383 which is connected to the first port 358 of the flip-flop circuit, a drain 384 connected to ground, and a gate 385 connected to a node 386 which is connected to the second port 360 of the flip-flop circuit; a second memory transistor 387 having a source 388 connected to node 386, a drain 389 connected to ground, and a gate 390 connected to the node 383; a first load element 391 having a first terminal connected to a system voltage source VCC, and a second terminal connected to the node 383; and a second load element 392 having a first terminal connected to the system voltage source VCC, and a second terminal connected to the node 386.

Figure 7:
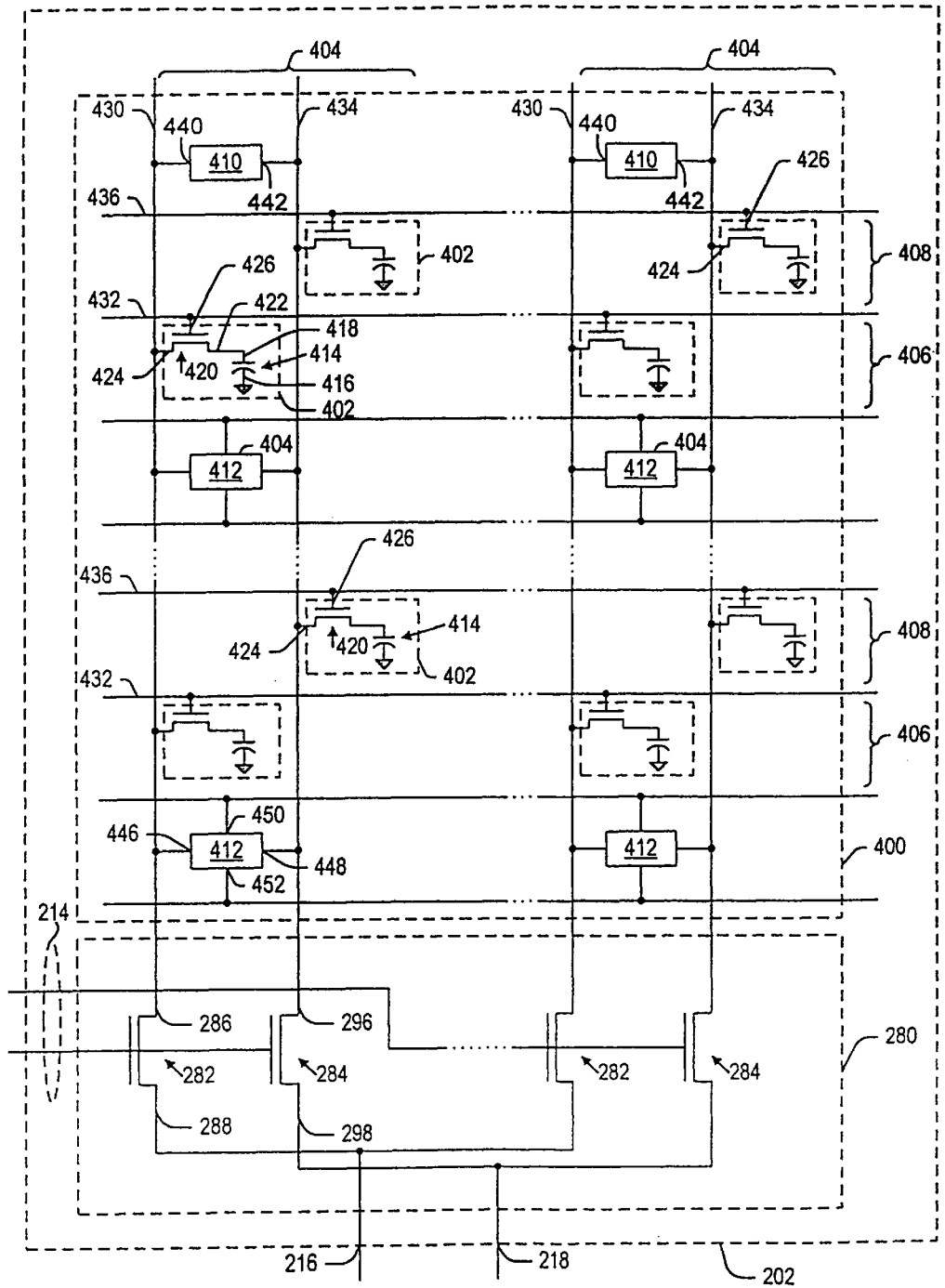
FIG. 7 is a schematic diagram illustrating an embodiment of a front array block of FIG. 4 including a memory cell array of dynamic RAM (DRAM cells), more than one column sense amplifier, and a column multiplexer.

FIG. 7 shows a schematic diagram illustrating another embodiment of the front array block 202 (FIG. 4) including a dynamic RAM memory cell array 400 coupled with the column multiplexer 280. The memory cell array 400 includes: a plurality of dynamic RAM (DRAM cells) 402 arranged in a number of rows and columns 404 wherein the rows include a plurality of even rows 406 and a plurality of odd rows 408; a pre-charge circuit 410 associated with each column 404; and a plurality of column amplifiers 412.

Each of the DRAM cells 402 includes: a cell capacitor 414 having a first terminal 416 connected to ground, and a second terminal 418; and an access transistor 420 having a source 422 connected to the second terminal 418 of the cell capacitor, a cell drain 424, and a cell gate 426. Each SRAM cell 402 of each even row 406 has its cell drain 424 connected to a corresponding one of the primary bit lines 430, and its cell gate 426 connected to a corresponding one of the even row word lines 432. Each DRAM cell of each odd row 408 has its cell drain 424 connected to a corresponding one of the complementary bit lines 434, and its cell gate 426 connected to a corresponding one of the odd row word lines 436.

Each of the pre-charge circuits 410 includes a first port 440 connected to a corresponding one of the primary bit lines 430, and a second port 442 connected to a corresponding one of the complementary bit lines 434. Before one of the memory cells 402 is accessed, that is before activating a corresponding one of the word lines 432, 436, each of the pre-charge circuits 410 charges the corresponding bit line pair up to half of the supply potential (not shown), that is VCC/2. Also, the bit line pairs are short circuited by a transistor so that they are each at an equal potential. After this equalizing and precharging process is completed, the precharge circuits are deactivated.

Each column amplifier 412 of each column 404 includes a first data port 446 connected to a corresponding one of primary bit lines 430, a second data port 448 connected to a corresponding one of complementary bit lines 434, a first control input 450 connected to a first amplifier control line, and a second control input 452 connected to a second amplifier control line. Each column amplifier 412 typically includes an amplifier device which is enabled by pulling control line 450 to a high voltage level and by pulling control line 452 to ground.

The depicted array block also includes the column multiplexer 280 for selecting columns 404 of memory cell array 400 wherein the source 286 of each primary transfer gate 282 is connected to a corresponding one of the primary bit lines 430, and the source 296 of each complementary transfer gate 284 is connected to a corresponding one of the complementary bit lines 434. The column multiplexer 280 is controlled in the same manner as described above with reference to FIGS. 4 and 5.

Figure 8:
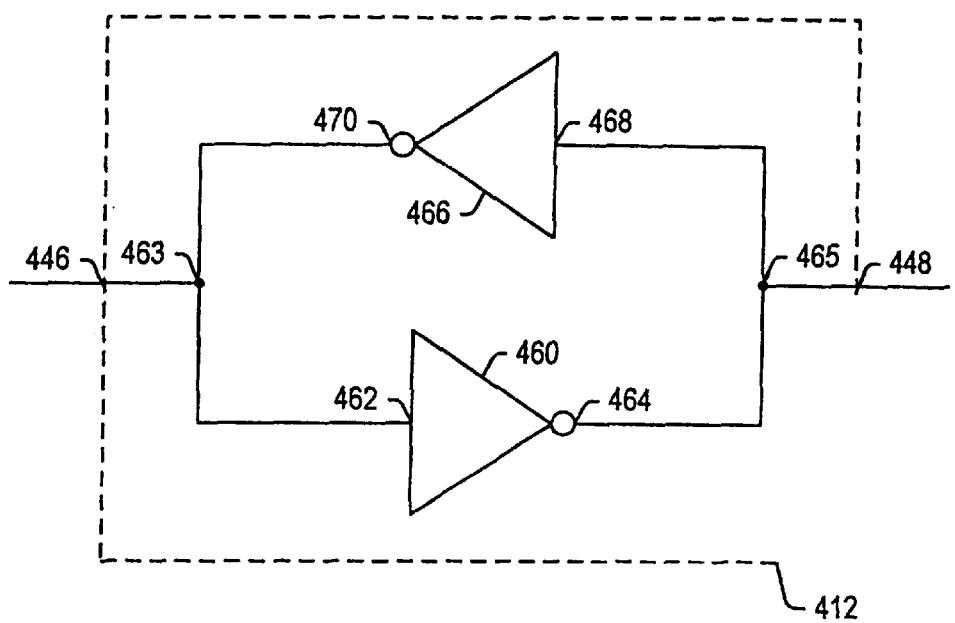
FIG. 8 is a generalized circuit block diagram of a preferred embodiment of one of the column sense amplifiers of FIG. 7.

FIG. 8 is a generalized circuit block diagram of a preferred embodiment of one of the column sense amplifiers 412 of FIGS. 7 and 8. The depicted column sense amplifier 412 generally includes: a first buffer 460 having an input 462 connected to a first node 463 which is connected to the first port 446 of the column sense amplifier 412, and an output 464 connected to a second node 465 which is connected to the second port 448 of the column sense amplifier 412; and a second buffer 466 having an input 468 connected to the second node 465, and an output 470 connected to the first node 463.

The intermediate sense amplifiers used in the prevent invention provide amplification of voltage potentials across bit line pairs between array blocks. Because memory devices may include a plurality sub-arrays each including a plurality of intermediate sense amplifiers, the potential between each bit line pair is amplified several times before it reaches block sense amplifier which provides a final stage of amplification. The amplification provided by intermediate sense amplifier s allows for higher gains and faster sensing by block/global sense amplifier.

The size of each of sub-arrays, that is the number of memory cells in each of sub-arrays, may be adjusted according to parameters including the cell current or cell charge, bit line capacitance, bit line resistance, and intermediate sense amplifier circuit to optimize sensing speed.

The data signals are amplified by intermediate sense amplifiers provided between a number of word lines. The number of rows of memory cells provided between intermediate sense amplifiers is determined by a number of factors such as the distributed resistance and capacitance (RC) of the bit line pairs, cell current/charge, and intermediate sense amplifiers, to optimize the sensing speed and layout area.

Although the present invention has been described above in terms of specific embodiments, it is anticipated that alterations and modifications thereof will no doubt become apparent to those skilled in the art. Accordingly, it is intended that the following claims cover all such alterations and modifications as fall within the true spirit and scope of the invention.

What is claimed is:

1. A semiconductor integrated circuit device comprising:
   a plurality of memory cells subdivided into array blocks each including M cell rows and N cell columns, said array blocks being arranged in array block rows and array block columns, each said cell of each said cell row of each said array block being coupled to an associated one of M word lines, each said cell of each said cell column being selectively coupled to develop a data signal between an associated bit line pair including a primary bit line and a complementary bit line,
   a row decoder coupled to provide a corresponding row address signal to each of said M word lines for addressing said cell rows;
   each said array block column including,
      a plurality of column multiplexers each including N multiplexer input ports connected to receive one of said data signals from one of said bit line pairs of an associated one of said array blocks, and a multiplexer output port providing said data signals from selected ones of said N multiplexer input ports,
      a plurality of intermediate sense amplifiers for amplifying said data signals, and including an amplifier input port connected to receive said data signals from a corresponding one of said multiplexer output ports, and an amplifier output port for providing pre-amplified data signals, and
      a plurality of column demultiplexers each including a demultiplexer input port connected to receive said pre-amplified data signals from an associated one of said amplifier output ports, and a plurality of demultiplexer output ports each connected to one of said bit line pairs of a corresponding one of said array blocks; and
   a plurality of column decoders coupled to provide column select signals to each said column multiplexer and column demultiplexer of each said array block column, wherein each said column multiplexer and column demultiplexer of each said array block column receives the same set of column select signals.

* * * * *